United States Patent [19]

Saito et al.

[11] Patent Number: 5,360,672
[45] Date of Patent: Nov. 1, 1994

[54] PROCESS FOR TREATING FILM COMPRISING LIQUID CRYSTAL POLYMER

[75] Inventors: Koichi Saito, Okayama; Takeichi Tsudaka, Kurashiki, both of Japan

[73] Assignee: Kuraray Co., Ltd., Kurashiki, Japan

[21] Appl. No.: 865,139

[22] Filed: Apr. 8, 1992

[30] Foreign Application Priority Data

Apr. 8, 1991 [JP] Japan ................... 3-103959

[51] Int. Cl.$^5$ ................ B32B 27/06; B32B 27/36
[52] U.S. Cl. ................ 428/480; 428/1; 428/906; 428/910; 427/177; 427/385.5; 264/138; 264/165; 264/230; 264/239; 264/280; 264/345
[58] Field of Search ......... 428/480, 906, 910, 1; 427/177, 385.5; 264/138, 165, 230, 239, 280, 345

[56] References Cited

U.S. PATENT DOCUMENTS

| | | | |
|---|---|---|---|
| 4,384,016 | 5/1983 | Ide et al. | 428/1 |
| 4,394,498 | 7/1983 | Kastejic | 264/28 |
| 4,863,767 | 9/1989 | Garg et al. | 428/1 |

FOREIGN PATENT DOCUMENTS

| | | |
|---|---|---|
| 0206599 | 12/1986 | European Pat. Off. |
| 0484818 | 5/1992 | European Pat. Off. |
| 2166685 | 5/1986 | Japan |
| 9253739 | 2/1992 | Japan |

OTHER PUBLICATIONS

Database WPIL, AN 88-130502, & JP-A-63-074-622, Apr. 5, 1988.
Database WPIL, AN 88-232818, & JP-A-63-168-327, Jul. 12, 1988.

*Primary Examiner*—John Kight, III
*Assistant Examiner*—Duc Truong
*Attorney, Agent, or Firm*—Oblon, Spivak, McClelland, Maier & Neustadt

[57] ABSTRACT

A process for treating a film comprising a liquid crystal polymer capable of forming an optically anisotropic melt phase, which comprises passing the film between press rolls at a temperature in a range of from 80° C. below the melting point of the liquid crystal polymer to 5° C. below the same melting point and under a linear pressure of 20 to 400 kg/cm.

16 Claims, No Drawings

PROCESS FOR TREATING FILM COMPRISING LIQUID CRYSTAL POLYMER

BACKGROUND OF THE INVENTION

1. Field of the Invention

The present invention relates to a process for treating a film comprising a liquid crystal polymer capable of forming an optically anisotropic melt phase, which comprises pressing it under specific conditions.

2. Description of the Related Art

Polymers capable of forming an optically anisotropic melt phase, i.e. what is known as thermotropic liquid crystal polymer, have regularity already in the melted state. Film formation by melt extrusion, such as T-die process and tubular film process, of the polymers therefore generally give films having large anisotropy in mechanical strength and elongation between the machine direction (hereinafter referred to as "MD") and a direction perpendicular thereto (hereinafter referred to as "TD"), whereby in extreme cases the films readily split in MD. Several processes have been proposed to reduce the anisotropy in the mechanical properties of films comprising thermotropic liquid crystal polymers. For example Japanese Patent Application Laid-open No. 45027/1983 proposes a process for orienting a film comprising a thermotropic liquid crystal polyester; which comprises passing the film through at least one pair of press rolls at a temperature in a range of from 100° C. lower than the glass transition temperature of the film to a temperature lower than the flow temperature. According to the literature, the process can give films having good properties not only in MD but also in TD. Japanese Patent Application Laid-open No. 168327/1988 discloses a process for rolling a sheet which comprises passing a uniaxially oriented sheet comprising a liquid crystal polyester consisting of units from p-hydroxybenzoic acid, units from terephthalic acid and units from ethylene glycol between 2 pieces of rolls at a temperature at least the flow temperature and lower than the melting point of the liquid crystal polyester. The literature describes that a sheet thus rolled to a thickness of 95 to 50% of the original thickness can be provided with improved tensile strength and flexural modulus in TD without decreasing to a large extent the tensile strength and flexural modulus in MD.

As a result of a study made by the present inventors, it has been found that films obtained from liquid crystal polymers by melt extrusion generally have, in addition to large anisotropy in mechanical properties as described above, the drawback of small abrasion resistance of their surface, whereby the surface readily generate fluffs or naps by abrasion. These drawbacks have presented principal restrictions to development of end-uses. Besides, the present inventors attempted to apply the orienting process described in the above Japanese Patent Application Laid-open No. 45027/1983 and the rolling process described in the above Japanese Patent Application Laid-open No. 168327/1988 to films comprising liquid crystal polymers but could not obtain the intended rolled film having uniform thickness in a high yield, the processes being of poor reproducibility.

Accordingly, an object of the present invention is to provide a simple process for improving abrasion resistance and reducing the anisotropy in mechanical properties films comprising liquid crystal polymers.

Another object of the present invention is to provide a film having improved abrasion resistance and reduced anisotropy in mechanical properties.

Still another object of the present invention is to provide a use that makes the most of the features of the above film.

SUMMARY OF THE INVENTION

The present invention provides a process for treating a film comprising a liquid crystal polymer capable of forming an optically anisotropic melt phase, which comprises passing the film between press rolls at a temperature in a range of from 80° C. below the melting point of the liquid crystal polymer to 5° C. below the same melting point and under a linear pressure of 20 to 400 kg/cm.

The present invention further provides the film obtained by the above pressing.

The present invention still further provides a laminate comprising a layer of the film obtained by the above pressing.

The present invention yet further provides a flexible printed wiring board comprising a substrate comprising a layer of the film obtained by the above pressing.

DETAILED DESCRIPTION OF THE PREFERRED EMBODIMENTS

The liquid crystal polymers usable in the present invention are those capable of forming optically anisotropic melt phase, i.e. what are known as thermotropic liquid crystal polymers. Such polymers capable of forming optically anisotropic melt phase have, as is well known in the art, the feature of transmitting polarized light, when their specimens in the melted state are observed under a crossed nicol with a polarization microscope equipped with a heating device.

Known thermotropic liquid crystal polyesters or polyester amides derived from compounds exemplified in the following groups (1) through (4), or their derivatives can be used in the present invention. Suitable combination and the amounts used of the starting material compounds are necessarily selected for obtaining a polymer capable of forming thermotropic liquid crystal. (1) Aromatic or aliphatic dihydroxy compounds

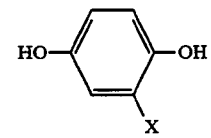

wherein X represents a hydrogen atom, a halogen atom or a lower alkyl, phenyl or like groups;

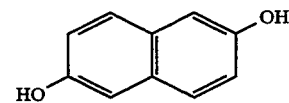

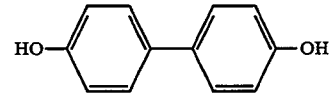

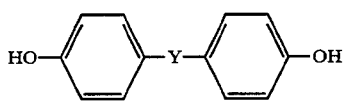

wherein Y represents —O—, —CH$_2$—, —S— or like groups;

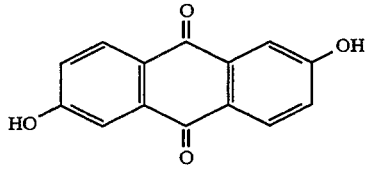

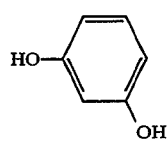

HO(CH$_2$)$_n$OH wherein n represents an integer of 2 to 12.

(2) Aromatic or aliphatic dicarboxylic acids

HOOC—⟨⟩—COOH (naphthalene-2,6-dicarboxylic acid)

HOOC—⟨⟩—⟨⟩—COOH

HOOC—⟨⟩—O—⟨⟩—COOH

HOOC—⟨⟩—OCH$_2$CH$_2$O—⟨⟩—COOH (isophthalic acid structure)

HOOC(CH$_2$)$_n$COOH wherein n represents an integer of 2 to 12.

(3) Aromatic hydroxycarboxylic acids

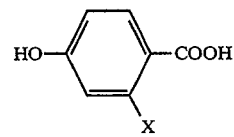

wherein X represents a hydrogen atom, a halogen atom or a lower alkyl, phenyl or like groups.

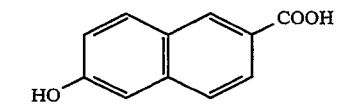

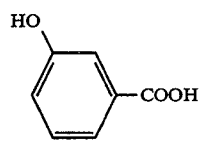

(4) Aromatic diamines, aromatic hydroxy amines or aromatic aminocarboxylic acids

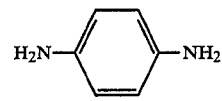

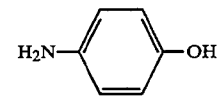

Representative examples of the liquid crystal polymer are the following copolymers (a) through (e) having various structural units.

(a) Copolymers consisting of

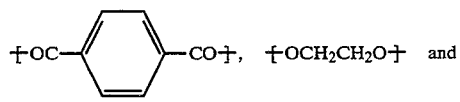

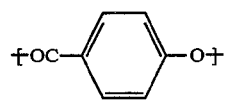

(b) Copolymers consisting of

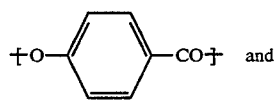

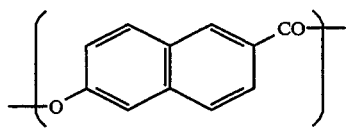

(c) Copolymers consisting of

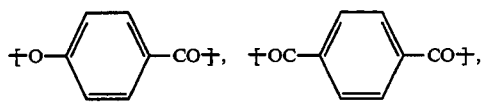

and

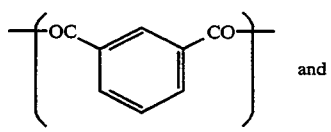

(d) Copolymers consisting of

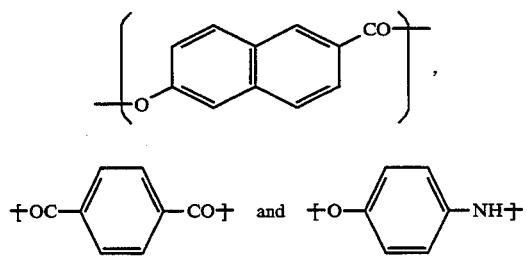

(e) Copolymers consisting of

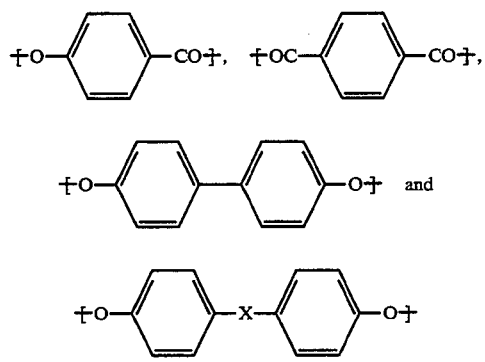

wherein X represents —O—, —CH$_2$—, —S— or like groups.

Among the above, thermotropic liquid crystal polyesters consisting essentially (preferably in amounts of at least 95 mol % of the total structural units) of the following structural units (I) and (II)

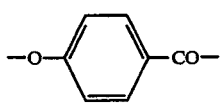

(I)

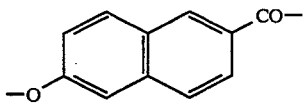

(II)

are preferred because of their high processability and high thermal resistance of films obtained therefrom. In such thermotropic liquid crystal polyesters, the molar ratio between the structural unit (I) and the structural unit (II), [(I)/(II)], is preferably in a range of 90/10 to 10/90, more preferably in a range of 85/15 to 65/35 and most preferably in a range of 80/20 to 70/30.

The liquid crystal polymers used in the present invention preferably have a transition temperature to an optically anisotropic melt phase of 200° to 400° C., in particular 250° to 350° C., in view of the thermal resistance and processability of film. They may incorporate a lubricant, an antioxidant, a filler and like additives within limits not to impair the properties of the resulting films.

The film comprising a liquid crystal polymer and used in the present invention is formed by a known process such as T-die process or tubular film process and may be stretched uniaxially or biaxially.

The film comprising a liquid crystal polymer and used in the present invention preferably has a thickness of not more than 500 μm, more preferably 10 to 500 μm, most preferably 10 to 250 μm.

In the present invention, it is necessary to press the film comprising liquid crystal polymer with press rolls and at a temperature in a range of from 80° C. below the melting point of the liquid crystal polymer to 5° C. below the same melting point. A simple and preferred process for this pressing comprises pressing the film by passing it between press rolls having a surface temperature in a range of from 80° C. below the melting point of the liquid crystal polymer to 5° C. below the same melting point. In this process utilizing press rolls having a surface temperature within the above range, the film is, when passing through the nip between the press rolls having the temperature, simultaneously pressed and heated to substantially the same temperature as that of the press rolls. In this process utilizing such heated press rolls, it is sufficient that at least one pair of the press rolls sandwiching the film have a temperature within the above range.

The film does not substantially melt under the heat pressing condition employed in the present invention. If the pressing temperature exceeds a temperature 5° C. lower than the melting point of the liquid crystal polymer, the film will sometimes flow during pressing to markedly decrease its thickness and to be of poor shape and further the mechanical properties of the film will decrease to a large extent. On the other hand, if the pressing temperature is lower than the melting point of the liquid crystal polymer by more than 80° C., there will hardly be produced the effect of improving the abrasion resistance and reducing the anisotropy in mechanical properties.

The pressing temperature is preferably in a range from 50° C. lower than the melting point of the liquid crystal polymer to 10° C. lower than the same melting point, which produces particularly large effect of improving the abrasion resistance and reducing the anisotropy in mechanical properties.

The term "the melting point of a liquid crystal polymer" herein is a temperature where the endothermic peak of melting is observed by differential scanning calorimetry (DSC) when a specimen of the film of the liquid crystal polymer to be subject to the pressing is heated at a temperature elevation rate of 10° C./min.

In the present invention, the pressure applied to a film for pressing the film at a temperature within the above specific range is 20 to 400 kg/cm as converted into linear pressure. With a linear pressure of less than 20 kg/cm the effect of improving abrasion resistance and reducing the anisotropy is not sufficiently produced, while with a linear pressure of more than 400 kg/cm the film suffers a substantial size change and, besides, tends to break. The linear pressure is preferably 50 to 300 kg/cm, with which markedly large effect of improving abrasion resistance and reducing anisotropy is produced.

In the present invention, the film subjected to the pressing deforms temporarily to a very small extend during the pressing, but there occurs no substantial difference in the film thickness before and after the pressing. The effective pressure under such a condition is expressed in terms of "the linear pressure of press roll".

The linear pressure of press roll herein means a quotient obtained by dividing the force applied to the press roll by the effective width of the press roll.

The press rolls used in the present invention preferably have a diameter of 200 to 1,000 mm, more preferably 300 to 600 mm.

Known press rolls are appropriately selected and used in the present invention and their examples are chrome-plated metal rolls and metal rolls coated with thin layer of Teflon, silicone rubber, polyimide resin or the like.

In the present invention, the rotation speed of the press rolls permitting a film to pass therethrough, at a temperature in a range of from 80° C. below the melting point of the liquid crystal polymer constituting the film to 5° C. below the same melting point, is preferably not more than 30 m/min, more preferably not more than 20 m/min as converted into the linear speed of the circumference of the roll, for the purpose of effectively producing the effect of the present invention. Although the rotation speed has no specific lower limit, it is desirable in commercial production to maintain the speed not lower than 0.5 m/min because too low a speed will decrease productivity.

Under pressing conditions according to the present invention, the film does not substantially change the size (in most cases the film after the treatment maintains at least 98% of the original thickness) and, besides, tends to decrease its molecular orientation in MD.

The films obtained by the pressing treatment according to the present invention has, in addition to excellent thermal resistance inherent to liquid crystal polymer, excellent resistance to surface abrasion and good mechanical properties, those in TD being close to those in MD. The film may be used as it is and may also be used in the form of laminates with other materials. The film is therefore useful as a substrate for flexible printed wiring board (FPC), tape for TAB (tape automated bonding), electrical insulation tape and the like.

The film obtained by the pressing according to the present invention can be used for producing FPC by the usual process which comprises forming electric circuit from a conductive material on the surface of the film and then as required conducting after-processing such as lamination of a cover film or perforation. For the purpose of forming electric circuit from a conductive material, there may be employed a known process which comprises producing a laminate comprising the film layer and the conductive material layer and chemically etching the laminate to permit the conductive material layer to form the desired circuit pattern or a process which comprises forming a thin layer of conductive material constituting a circuit pattern an the film surface by sputtering. The conductive material used for this purpose is selected from the usual metals used for electrical connection and its preferred examples are gold, silver, copper, nickel and aluminum, among which particularly preferred is copper. It is desirable that the shape of the conductive material usable for producing a laminate with the above film layer be metal foil shape such as copper foil. The thickness of the metal foil is preferably 10 to 1,000 μm, more preferably 15 to 150 μm. In the preparation of such laminates, optional adhesives may be used for adhering a metal foil to the film comprising a liquid crystal polymer. Since resistance to molten solder-heat is generally required for FPC, the adhesive used is preferably selected from those capable of exhibiting, after adhesion, excellent performances not only in electrical insulation property but also in thermal resistance. Examples of preferred adhesives from this viewpoint are thermosetting-type epoxy, silicone, epoxy-nylon, unsaturated polyester and imide adhesives.

Having generally described this invention, a further understanding can be obtained by reference to certain specific examples which are provided herein for purpose of illustration only and are not intended to be limitative of this invention unless otherwise specified.

In the Reference Example, Examples and Comparative Examples that follow, the laminates obtained were evaluated according to the following methods.

(1) Melting point of liquid crystal polymer

A specimen liquid crystal polymer film was, by differential scanning calorimetry (DSC), heated at a temperature elevation rate of 10° C./min and the temperature at which endothermic peak of melting was observed was reported as the melting point.

(2) Tensile strength and elongation

The tensile strength and elongation of specimen film was tested according to JIS K6854.

(3) Abrasion resistance

An abrasion mass having a size of 10 mm × 15 mm and covered with a fabric was placed on a specimen film. While a load of 500 g was being applied, the mass was permitted to reciprocally slide forward and backward on the specimen surface over a distance of 30 mm. The number of strokes until that naps were found by visual observation to generate on the film surface was recorded and used as an index of abrasion resistance.

(4) Retention of thickness

This is the percentage of the thickness of a specimen film obtained by heat pressing based on the thickness before pressing.

(5) Orientation

A specimen film was tested by X-ray diffraction method and the orientation of the specimen in (006) plane based on the MD of the specimen was determined by the usual method from the diffraction intensity of (006) plane.

REFERENCE EXAMPLE

A reaction vessel equipped with a stirrer and a vacuum distillation column was charged with 70 parts by weight of p-acetoxybenzoic acid and 30 parts by weight of 6-acetoxy-2-naphthoic acid. The inside of the vessel was fully replaced by nitrogen gas, and the vessel was heated to a temperature of 250° C. while nitrogen gas was being streamed thereinto. The contents were stirred at 250° C. for 3 hours and then at 280° C. for 1 hour and a quarter. The polymerization temperature was elevated to 320° C. and the system was kept at the temperature for 25 minutes. The system was then gradually evacuated and kept under the conditions of 0.1 to 0.2 mmHg and 320° C. for 25 minutes, after which the inside pressure was returned to atmospheric pressure and the obtained thermotropic liquid crystal polyester was withdrawn.

The liquid crystal polyester thus obtained was capable of forming an optically anisotropic melt phase and had a melt viscosity as measured under the conditions of 300° C. and a shear rate of 100 sec$^{-1}$ of 2,700 poise.

The liquid crystal polyester was formed into a film having a thickness of 80 μm by tubular film process using a single-screw extruder at a heating temperature of 280° to 300° C. and under the conditions of a draw ratio of 2.3 and a blow ratio of 2.1. The film thus obtained had a good appearance and showed a melting temperature as measured by DSC of 275° C.

EXAMPLE 1

The film obtained in Reference Example was fed through a clearance of 75 μm between 2 pieces of chrome-plated iron rolls each having a diameter of 400 mm at a linear speed of the roll of 1.0 m/min and under a linear pressure of roll of 280 kg/cm. The 2 iron rolls were each heated with a housed-in electric heater to maintain their surface temperature at 250° C.

The thickness retention of the film obtained was 100%. The film showed no size change either in MD and TD as compared with the size before pressing. The mechanical properties and orientation of the obtained film, together with those before the pressing, are shown in Table 1.

TABLE 1

| | Abrasion resistance (times) | Tensile strength (kg/mm$^2$) | | Elongation (%) | | Orientation (%) |
|---|---|---|---|---|---|---|
| | | MD | TD | MD | TD | |
| Film before pressing | 3 | 46 | 14 | 9 | 16 | 80 |
| Film after pressing | 40 | 30 | 25 | 15 | 19 | 40 |

EXAMPLES 2 THROUGH 9 AND COMPARATIVE EXAMPLES 1 AND 2

Example 1 was repeated several times except for changing the roll linear speed to 1.2 m/min and each time employing the conditions of roll surface temperature and linear pressure as shown in Table 2, to press the film obtained in Reference Example. The abrasion resistances and thickness retentions of the films thus pressed are shown in Table 2.

TABLE 2

| | Press conditions | | Film obtained | |
|---|---|---|---|---|
| | Surface temperature (°C.) | Linear pressure (kg/cm) | Abrasion resistance (times) | Thickness retention (%) |
| Example 2 | 250 | 200 | 38 | 100 |
| 3 | 200 | 200 | 26 | 100 |
| 4 | 230 | 200 | 32 | 100 |
| 5 | 260 | 200 | 41 | 100 |
| 6 | 270 | 200 | 25 | 99 |
| 7 | 250 | 40 | 32 | 100 |
| 8 | 250 | 100 | 36 | 100 |
| 9 | 250 | 350 | 38 | 99 |
| Comparative Example 1 | 180 | 200 | 4 | 100 |
| Comparative Example 2 | 250 | 10 | 5 | 100 |

COMPARATIVE EXAMPLE 3

Example 2 was repeated except for changing the roll surface temperature to 290° C., to press the film. The film obtained had a thickness retention of only 24%. The film had a non-uniform shape and low tensile strength.

COMPARATIVE EXAMPLE 4

Example 2 was repeated except for changing the roll linear pressure to 410 kg/cm, to press the film. During pressing the film broke frequently. The unbroken part of the pressed film had a thickness retention of 85%.

EXAMPLE 10

A copper foil having a thickness of 18 μm was adhered to one surface of each of the films obtained in Examples 1 through 9, to obtain laminates of film layer/copper foil layer. The adhesion procedure was as follows. A mixture of 00 parts by weight of an epoxy-based main composition (Epikote ® 828, made by Yuka Shell Epoxy Co.) and 20 parts by weight of an amine-based curing agent (Epikure ® Z, made by Yuka Shell Epoxy Co.) was applied to one surface of the copper foil in an amount of 10 mg/cm$^2$. The film was laid on that surface and the resulting layers were heated at 120° C. for 1 hour and then heated under pressing at 200° C. for hour.

EXAMPLE 11

The 9 types of the laminates obtained in Example 10 were used for producing FPC in the usual manner, as follows.

On the copper foil side of each of the laminates was applied a photo resist solution to a uniform thickness by spin coating. After removal of solvent, the image (pattern) of a photo mask film was printed on the photo resist membrane formed on the surface of the copper foil of each of the laminates. The printing was performed by closely laying on the photo resist membrane the photo mask film having a pattern corresponding to the desired circuit and then irradiating ultraviolet light from above the photo mask film. After part of the photo resist membrane that had not been irradiated had been dissolved off, the exposed part of the copper foil was removed by chemical etching, whereby electric circuit was formed with copper foil on the liquid crystal polyester film. Thus, the desired FPC's were produced.

Obviously, numerous modifications and variations of the present invention are possible in light of the above teachings. It is therefore to be understood that within the scope of the appended claims, the invention may be practiced otherwise than as specifically described herein.

We claim:

1. A process for improving abrasion resistance of a film comprising a liquid crystal polymer capable of forming an optically anisotropic melt phase, which comprises passing said film having a thickness of 500 μm or less between press rolls at a temperature in a range of from 80° C. below the melting point of the liquid crystal polymer to 5° C. below the same melting point and under a linear pressure of 20 to 400 kg/cm wherein the pressed film maintains at least 98% of its original thickness.

2. A process according to claim 1, wherein said temperature is in a range of from 50° C. below the melting point of the liquid crystal polymer to 10° C. below the same melting point.

3. A process according to claim 1, wherein said linear pressure is 50 to 300 kg/cm.

4. A process according to claim 1, wherein said press rolls rotate for the pressing at a linear speed of the circumference of roll of 0.5 to 30 m/min.

5. A process according to claim 1, wherein the film after the pressing maintains a thickness of at least 99% of that before the pressing.

6. A process according to claim 1, wherein said liquid crystal polymer is a thermotropic liquid crystal polyester consisting essentially of the following structural units (I) and (II)

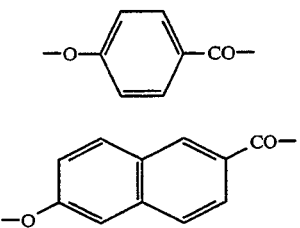

with the molar ratio between the structural unit (I) and the structural unit (II), being in a range of from 90/10 to 10/90.

7. A film having improved abrasion resistance obtained by pressing a film comprising a liquid crystal polymer capable of forming an optically anisotropic melt phase by passing said film having a thickness of 500 μm or less between press rolls at a temperature in a range of from 80° C. below the melting point of the liquid crystal polymer to 5° C. below the same melting point and under a linear pressure of 20 to 400 kg/cm wherein the pressed film maintains at least 98% of its original thickness.

8. A film according to claim 7, wherein said temperature is in a range of from 50° C. below the melting point of the liquid crystal polymer to 10° C. below the same melting point.

9. A film according to claim 7, wherein said linear pressure is 50 to 300 kg/cm.

10. A film according to claim 7, wherein said press rolls rotate for the pressing at a linear sped of the circumference of roll of 0.5 to 30 m/min.

11. A film according to claim 7, said film maintaining a thickness of at least 99% of that before the pressing.

12. A film according to claim 7, wherein said liquid crystal polymer is a thermotropic liquid crystal polyester consisting essentially of the following structural units (I) and (II)

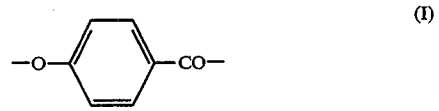

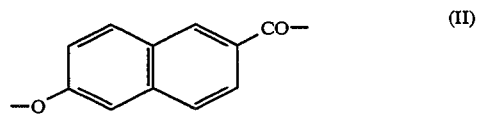

with the molar ratio between the structural unit (I) and the structural unit (II), [(I)/(II)], being in a range of from 90/10 to 10/90.

13. A laminate comprising a layer of the film of claim 7.

14. A laminate comprising a layer of the film of claim 12.

15. A flexible printed wiring board comprising a substrate comprising the film of claim 7.

16. A flexible printed wiring board comprising a substrate comprising the film of claim 12.

* * * * *